United States Patent [19]

Keller et al.

[11] 4,158,589
[45] Jun. 19, 1979

[54] NEGATIVE ION EXTRACTOR FOR A PLASMA ETCHING APPARATUS

[75] Inventors: John H. Keller, Newburgh; Charles M. McKenna, Fishkill, both of N.Y.

[73] Assignee: International Business Machines Corporation, Armonk, N.Y.

[21] Appl. No.: 865,811

[22] Filed: Dec. 30, 1977

[51] Int. Cl.² .......................... B01K 1/00; C23F 1/02
[52] U.S. Cl. .................... 156/345; 156/643; 156/646; 204/164; 204/298
[58] Field of Search .............. 156/643, 646, 345; 204/156, 164, 192 E, 298; 219/121 P; 55/2, 3, 100; 250/369 LM, 528, 542

[56] References Cited

U.S. PATENT DOCUMENTS

| | | | |
|---|---|---|---|
| 3,336,211 | 8/1967 | Mayer | 204/164 |
| 3,361,659 | 1/1968 | Bertelson | 204/164 |
| 3,863,074 | 1/1975 | O'Hanlon et al. | 204/164 |
| 3,904,366 | 9/1975 | Grasenick | 204/164 |
| 3,994,793 | 11/1976 | Haruilchuck et al. | 204/164 |
| 4,006,340 | 2/1977 | Gorinas | 219/121 P |
| 4,010,089 | 3/1977 | Stowell et al. | 250/542 |
| 4,020,350 | 4/1977 | Ducas | 55/2 |
| 4,085,332 | 4/1978 | Fletcher | 55/100 |
| 4,094,764 | 6/1978 | Boucher et al. | 204/298 |
| 4,119,881 | 10/1978 | Calderon | 204/298 |
| 4,123,316 | 10/1978 | Tsuchimoto | 156/345 |

FOREIGN PATENT DOCUMENTS

53-38263 8/1978 Japan.

*Primary Examiner*—Jerome W. Massie
*Attorney, Agent, or Firm*—John A. Jordan

[57] ABSTRACT

Process and apparatus for use in extracting negative ions from a plasma which is particularly useful in reactive ion etching of metals, silicon and oxides and nitrides of silicon in the manufacture of semiconductor devices. A magnetic field is employed in the apparatus and, herein, is created by a novel grid, through which negative ions pass to a surface, such as one to be etched, while free electrons are prevented from passing through the grid and out of the plasma. The novel process utilizes negative ions which have a large fraction in the atomic state.

9 Claims, 4 Drawing Figures

NEGATIVE ION EXTRACTOR FOR A PLASMA ETCHING APPARATUS

FIELD OF THE INVENTION

The present invention relates, in general, to a method and apparatus for separating and extracting negative ions from a plasma while retaining free electrons in the plasma and, more specifically, using the negative ions in reactive ion etching.

BACKGROUND OF THE INVENTION

In semiconductor manufacturing, etching is required to expose areas of the silicon substrate for diffusion or ion implantation of impurities so as to form integrated circuits in the silicon substrate. One method of etching is by process of plasma etching or reactive ion etching. In this process, a chemically reactive gas, such as $CF_4$ is used. The surface of the silicon substrate to be etched is covered with a mask leaving selective areas of the surface exposed. The substrate with a surface to be etched is inserted into a chamber containing the reactive gas. To create the plasma, normally in RF voltage is applied across the gas to cause the gas to disassociate and form various positive and negative ions.

Highly reactive species, such as halogen and oxygen, especially in their atomic state, whether neutral or ionized, would be preferable in etching metals, silicon and oxides and nitrides of silicon. Atomic fluorine from plasma created from a gas of $CF_4$ with a small percentage of oxygen is believed to react with silicon and the oxides and nitrides of silicon according to the following reactions:

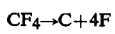
$$CF_4 \rightarrow C + 4F$$

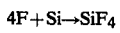
$$4F + Si \rightarrow SiF_4$$

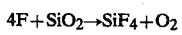
$$4F + SiO_2 \rightarrow SiF_4 + O_2$$

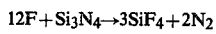
$$12F + Si_3N_4 \rightarrow 3SiF_4 + 2N_2$$

The etching or ashing of organic material such as photoresist also would be preferably done with atomic oxgen. A general reaction would be as follows:

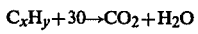
$$C_xH_y + 3O \rightarrow CO_2 + H_2O$$

It is desirable to achieve a flow of etchant which is enriched with these reactive species toward the substrate to be etched. These highly reactive species are characterized by high electronegativity. However, if a positive potential is applied to attract these species to the substrate, electrons will also be attracted and the plasma will collapse.

Accordingly, the primary object of the present invention is to provide a novel process and apparatus which takes advantage of this electronegative characteristic for separating and extracting these highly reactive species as negative ions from the plasma while substantially retaining the free electrons in the plasma.

A more specific object of the present invention is to provide a process and apparatus for directing negative ions separated from a plasma to a surface, such as one to be etched.

A further object of the present invention is to be able to adjust the energy of the negative ions so as to control the directionality of the etching.

A still further object of the present invention is to provide a reactive ion etching process in which a large fraction of the negative ions directed to the surface to be etched are in the atomic state.

Another object of the present invention is to design the apparatus such that the structure, for retaining the free electrons within the plasma while passing the negative ions, is simple and easy to manufacture.

SUMMARY OF THE INVENTION

In order to achieve the foregoing objects of the present invention, magnetic means is positioned adjacent the plasma and between the plasma and a substrate surface to which the ions of the plasma are to be directed. The magnetic means creates a magnetic field normal to the direction of flow of the ions and with a sufficient magnitude to retain the electrons but insufficient to prevent the ions from being directed toward the surface of the substrate.

Preferably, the magnetic means comprises a source grid containing ferromagnetic material positioned to separate the plasma from the substrate surface and having a magnetic field applied such that the path of the field crosses the openings in the grid. In the present instant, an acceleration grid, which is desirable but not necessary, is spaced adjacent the magnetic grid member between the member and the substrate and with the openings of the acceleration electrode in an aligned relationship with the openings of the magnetic grid. A potential is applied to the acceleration electrode which is positive relative to the magnetic source electrode and of sufficient magnitude to attract the negative ions and electrons out of the plasma to the openings of the magnetic source electrode. Alternatively, the positive potential is applied to the substrate when the acceleration electrode is not utilized. The magnetic field across each of the openings in the magnetic grid is of sufficient magnitude to retain the electrons but insufficient to prevent the negative ions, which are substantially heavier than electrons, from passing through the magnetic field and from reaching the substrate surface. These extracted negative ions will have a larger fraction of the reactive species in the atomic state than the species produced in the plasma because this state tends to be more electronegative.

BRIEF DESCRIPTION OF THE DRAWINGS

Still other and further objects, features and advantages of the invention will become more apparent from the following more particular description of preferred embodiments of the invention illustrated in the accompanying drawings.

DESCRIPTION OF THE PREFERRED EMBODIMENTS

Figure 1:
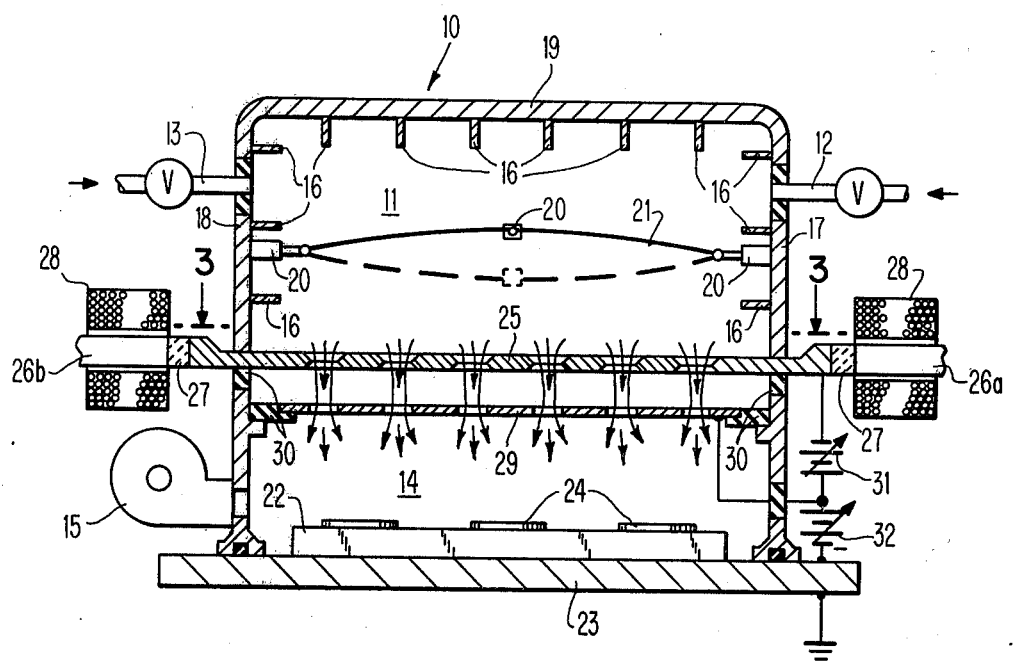
FIG. 1 is a cross-sectional side view of the preferred plasma reactor incorporating the ferromagnetic grid of the present invention.

Referring now to the drawing, the apparatus shown in FIG. 1 comprises a high vacuum enclosure 10 divided into an upper portion 11, into which a plasma forming gas is fed via valve controlled pipes 12, 13 and a lower portion 14 to which a vacuum pump 15 is connected A plurality of inwardly extending magnetic pole pieces 16 are mounted to sidewalls 17, 18 and top wall 19 and are spaced apart around the interior of the upper portion 11. Magnetic means (not shown) are coupled to the pole pieces 16 so that adjacent poles are not opposite polarity and a magnetic field spans the gap between them. Center mounted on each of the four walls is a filament holder 20 for supporting a filament or cathode 21 in approximately the center of the upper portion 11. The filament 21 is heated by DC (or AC) current flow to temperatures sufficient to produce thermal emission (~2500° C.). A DC potential of the order of 50 volts is applied to the filament 21 which causes the gas to ionize and form a plasma. A more detailed description of this type reactor with an ion thruster source is found in Ion Sources for Ion Machining Applications, H. R. Kaufman, P. D. Reader, and G. C. Isaacson, Vol. 15, No. 6, June 1977, pages 843–847.

Both positive and negative ions and radicals are present in the plasma in both molecular and atomic form. In reactive ion etching, these ions are directed to a substrate 22, carried on the base 23 of the vacuum enclosure 10, where they react with silicon wafers 24. This etching process involves a chemical reaction which combines with a physical etching process, and since this process depends on the direction of the ionic species as determined by the electric field, lateral etching under masks can be minimized, if desired, and nearly vertical etch steps can be achieved.

The etching rate can be accelerated by reacting primarily negative ions, especially in atomic form, and radicals with the substrate, because they are more reactive with the substrate, when it is either silicon and oxides and nitrides of silicon or organic materials, such as photoresist. In accordance with the present invention, magnetic means is disposed between upper portion 11 and the lower portion 14 of the vacuum enclosure 10 so that, when a positive potential is applied to the lower portion 14 to attract the negative ions and/or radicals, a magnetic field is created substantially normal to the direction of the path of the ions and of a magnitude sufficient to block the electrons from reaching the substrate, but insufficient to prevent the negative ions from reacting with the wafers 24 on the substrate.

In the present instance, the magnetic means comprises a ferromagnetic source grid electrode 25 composed of mild steel having a yoke 26a, 26b for completing a magnetic path from one side 26a of the source electrode 25 to the other 26b, the electrode 25 and the yoke 26a, 26b, being electrically separated from each other by insulators 27. Coupled to the yoke 26a, 26b is electromagnetic coil 28 for creating the magnetic field in the ferromagnetic grid. Preferably, an acceleration grid electrode 29 is positioned adjacent and parallel to the ferromagnetic grid 25 on the same side as the substrate 22. The grid electrode 29 and the magnetic grid 25 are mounted with their openings aligned and are separated by insulative blocks 30. A DC potential, variable from 100 to 2000 volts but, herein, 500 volts, is applied, from a variable power supply 31, across the magnetic grid 25 and electrode 29 with the positive polarity going to the electrode 29 to accelerate the negative ions/radicals to the substrate 22 carrying, herein, silicon wafers 24. The acceleration electrode 29 is maintained at a positive potential (providing a acel/decel effect) by means of a variable power supply 32. The substrate 22 is preferably at ground. By adjusting the potential between acceleration electrode 29 the substrate 22, vertical, essentially parallel sidewalls can be etched by a very rapid etch rate, or alternatively, if desired, lateral etching along with vertical etching can be accomplished at a reduced etch rate.

Figure 2:
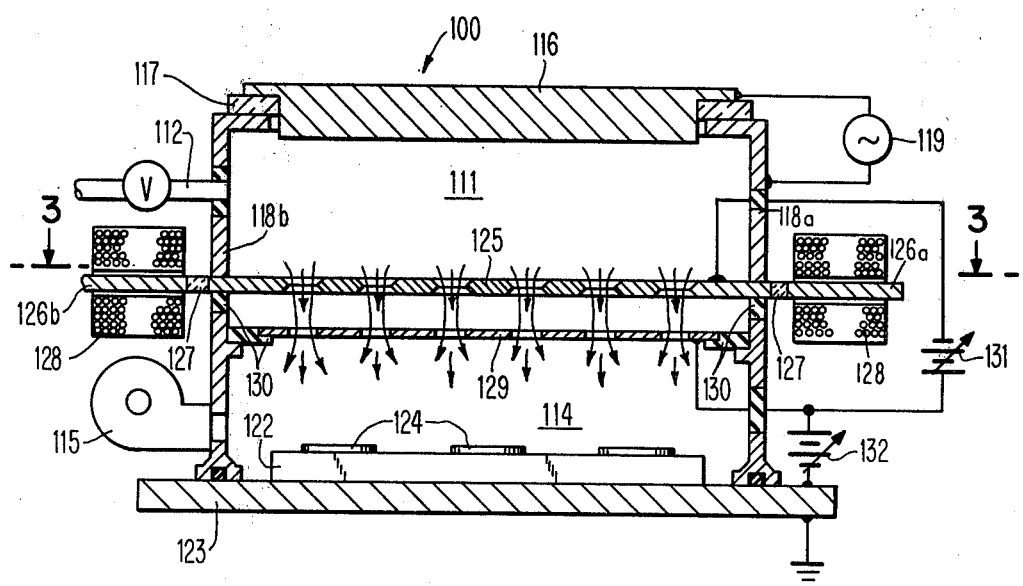
FIG. 2 is a cross-sectional side view of an alternative plasma reactor incorporating the ferromagnetic grid of the present invention.

In an alternative embodiment as shown in FIG. 2, the reactor apparatus comprises a high vacuum enclosure 100 divided into an upper portion 111 into which the plasma forming gas is fed via the valve controlled pipe 112. The upper portion 111 and a lower portion 114 connected to a vacuum pump 115 include a top plate or target electrode 116 of conductive material supported on an insulating seal 117 carried on the upper end of sidewalls 118a, 118b. Connected between the target electrode 116 and sidewalls 118a of the upper portion 111 is an RF power source 119 for applying energy to the gas to form a plasma. Normally, the frequency of the RF potential applied is greater than the plasma ion resonance frequency in the glow space of the plasma, and lower than the plasma electron resonance frequency. By varying the physical arrangement of the RF source and electrodes, the spacing and dimension of the electrode, the desired phenomenon, i.e. deposition or etching, can be caused to take place and can be optimized. Herein, in a reactive etching mode, the RF frequency is 13.56 megahertz, but can also be either 27.1 or 40.6 megahertz.

Again, in accordance with the present invention, magnetic means is disposed between the upper portion 111 and lower portion 114 of the vacuum enclosure 110 so that, when a positive potential is applied to the lower portion 114 to attract the negative ions and/or radicals, a magnetic field is created substantially normal to the direction of the path of the ions and of a magnitude sufficient to block the electrons from reaching the substrate, but insufficient to prevent the negative ions from reacting with the wafers 124 on the substrate 122. Herein, the magnetic means comprises a source grid electrode 125 containing ferromagnetic material, herein composed of mild steel, having a yoke 126a, 126b for completing a magnetic path from one side 126a to the other 126b, the electrode 125 and the yoke 126a, 126b being electrically separated from each other by insulators 127. Coupled to the yoke 126a, 126b is electromagnetic coil 128 for creating the magnetic field in the ferromagnetic grid or source electrode. Preferably, an acceleration electrode 129 is positioned adjacent and parallel to the source grid electrode 125 on the same side as the substrate 122. The grid electrode 129 and the magnetic grid 125 are mounted with their openings aligned and are separated by insulative blocks 130. A DC potential, variable from 100 to 2000 volts but, herein, 500 volts, is applied from a variable power supply 131 across the source electrode 125 and the acceleration electrode 129 to accelerate the negative ions/radicals to the substrate 122 carrying, herein, silicon wafers 124. The substrate 122 preferably is at ground. The acceleration electrode 125 is maintained at a positive potential (providing a acel/decel effect) by means of variable power supply 132. Again, the potential differential can be adjusted to vary the etch rate and the type of etching, i.e. vertical or vertical and lateral.

Figure 3:
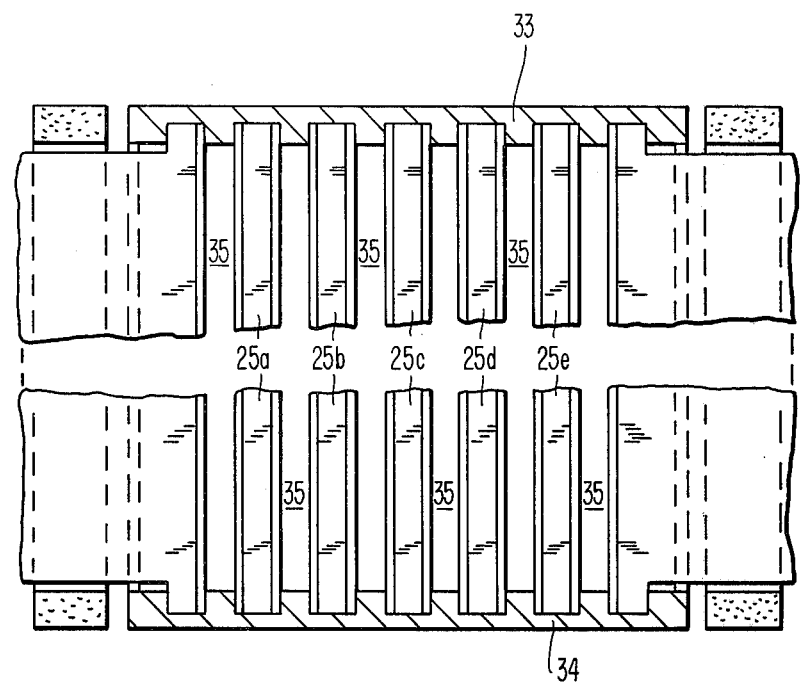
FIG. 3 is an enlarged, plan view of the ferromagnetic grid of the present invention.

Shown in more detail in FIG. 3, is the source grid 25 (FIG. 1) and 125 (FIG. 2) which comprise non-magnetic support members 34, 33, and which form the front and rear walls of the vacuum chamber 10 (FIG. 1).

Herein the support members 33, 34 are made of graphite, but other non-magnetic materials may be used as long as they can withstand high vacuum. Individual ferromagnetic bars 25a, 25b, 25c, 25d, and 25e extend laterally between the support members 33, 34. The edges of the bars 25a-e are beveled so as to further refine the magnetic field across the gaps 35 which, herein, are 1 mm. Alternately, the non-magnetic conductive support members 33, 34 also can underlie the ferromagnetic bar and serve to define the openings in the grid. The desired magnetic field strength across the gaps is a function of the electric field produced between the source electrode 25 and the acceleration electrode 29. Preferably, the width of the gap 37 between electrodes 25 and 29 is about 2 mm and the magnetic field is 950 gauss.

Figure 4:
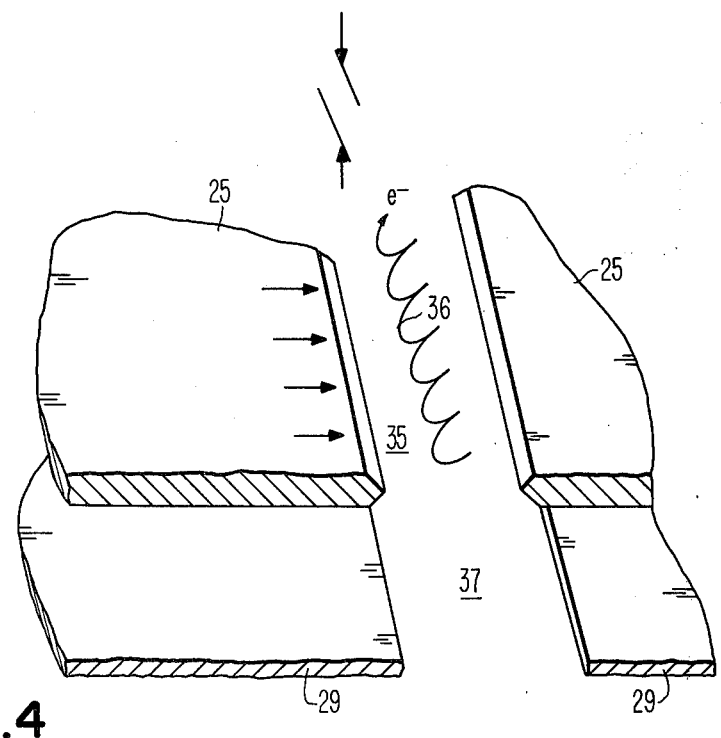
FIG. 4 is a further enlarged perspective view illustrating the influence on an electron by the magnetic field across a gap in the ferromagnetic grid.

For example, as shown in FIG. 4, to prevent an electron from passing through the gap 35 when 1000 volts are applied between the source electrode 25 and the acceleration electrode 29 spaced apart by 2 mm, a magnetic field of 1350 gauss would be necessary. With these conditions, the symbolic electron e⁻ under the influence of the competing electric and magnetic forces will follow the path shown at 36, which has a vertical distance of about 0.5 mm between the arrows. Therefore, the electron does not pass beyond the gap and out of the plasma.

The magnitude or strength of the magnetic field is determined by the following equation:

$$B = mv/qR = \sqrt{2mE}/qR$$

wherein:
R=0.25 mm
E=100 eV
m=m (electron)
q=q (electron)
and, accordingly:

$$B = \frac{[2 \times 9.1 \times 10^{-31} Kg \times 10^2 \times 1.6 \times 10^{-19} Kg\ m^2/sec^2]^{\frac{1}{2}}}{1.6 \times 10^{-19} coul \times 0.25 \times 10^{-3} m}$$

$$B = \frac{[29.2 \times 10^{-48} Kg^2 m^2/sec^2]^{\frac{1}{2}}}{0.4 \times 10^{-22} coul\ m}$$

$$B = \frac{5.4 \times 10^{-24} Kg/sec}{0.4 \times 10^{-22} coul}$$

B=13.5×10⁻² Kg/coul sec
B=13.5×10⁻²×10⁴ gauss
B=1350 gauss

While the invention has been particularly shown and described with reference to a preferred embodiment thereof, it will be understood by those skilled in the art that various changes in form and detail may be made therein without departing from the spirit and scope of the invention.

What is claimed is:
1. A plasma apparatus, suitable for reactive ion etching, comprising
 a vacuum enclosure including a first portion and second portion;
 means for creating a plasma of negative and positive ions and radicals in said first portion;
 a substrate mounted in second portion having a surface to be contacted by said ions;
 means for applying a potential between said plasma and said substrate and of a polarity for directing negative ions to said surface; and
 means for generating a magnetic field between said plasma and said substrate, and across more than one aperture connecting said first and second portions, said magnetic field being of a magnitude sufficient to retain electrons in the plasma, but insufficient to prevent negative ions from passing through the apertures and reaching said surface.

2. The appparatus of claim 1 wherein said potential applying means includes an electrode disposed between said magnetic field generating means and said substrate.

3. The apparatus of claim 2 wherein the potential applying means includes means for varying the potential so as to be able to pass negative ions of certain energies and direct them toward said substrate.

4. The apparatus of claim 1 wherein said magnetic means comprises a ferromagnetic grid.

5. The apparatus of claim 1 wherein an acceleration electrode grid means is positioned between said magnetic means and said substrate and having a potential applied thereto of positive polarity relative to the magnetic means.

6. In a plasma apparatus, for reactive ion etching, in which a plasma is separated from a substrate disposed in said apparatus and in which a potential is applied between said plasma and said substrate to attract species from the plasma and direct the species to said substrate, comprising the improvement of
 means for establishing the polarity of said potential such that the species withdrawn from the plasma are negative ions; and
 means for generating a magnetic field between said plasma and said substrate of a magnitude sufficient to retain electrons in the plasma, but insufficient to prevent the negative ions from reaching the substrate.

7. The apparatus of claim 6 wherein an acceleration electrode grid means is positioned between said magnetic means and said substrate and having a potential applied thereto of positive polarity relative to the magnetic means.

8. The apparatus of claim 6 wherein the magnetic means comprises a ferromagnetic grid.

9. The apparatus of claim 8 wherein said ferromagnetic grid also serves as a source electrode for said plasma.

* * * * *